United States Patent [19]
Konuma

[11] Patent Number: 6,127,279
[45] Date of Patent: Oct. 3, 2000

[54] SOLUTION APPLYING METHOD

[75] Inventor: Toshimitsu Konuma, Kanagawa, Japan

[73] Assignee: Semiconductor Energy Laboratory Co., Ltd., Kangawa-ken, Japan

[21] Appl. No.: 08/533,204

[22] Filed: Sep. 25, 1995

[30] Foreign Application Priority Data

Sep. 26, 1994 [JP] Japan .................................. 6-256149

[51] Int. Cl.[7] ................................................ H01L 21/00
[52] U.S. Cl. ........................................... 438/745; 438/753
[58] Field of Search ................................. 216/66, 94, 87, 216/91, 102, 103; 156/639.1; 438/745–759

[56] References Cited

U.S. PATENT DOCUMENTS

| | | | |
|---|---|---|---|
| 3,662,178 | 5/1972 | Caputi et al. ............................... | 216/87 |
| 4,444,616 | 4/1984 | Fujita et al. ................................ | 216/87 |
| 4,795,497 | 1/1989 | McConnell et al. ........................ | 134/18 |
| 4,895,617 | 1/1990 | Roche et al. ............................... | 216/103 |
| 5,032,217 | 7/1991 | Tanaka ........................................ | 216/91 |
| 5,051,137 | 9/1991 | Nold ............................................ | 134/42 |
| 5,147,826 | 9/1992 | Liu et al. .................................... | 438/486 |
| 5,176,783 | 1/1993 | Yoshikawa ................................. | 216/91 |
| 5,198,096 | 3/1993 | Foust et al. ................................. | 216/87 |
| 5,275,851 | 1/1994 | Fonash et al. .............................. | 427/578 |
| 5,312,516 | 5/1994 | Douglas et al. ............................ | 216/87 |
| 5,464,480 | 11/1995 | Matthews ................................... | 216/94 |

FOREIGN PATENT DOCUMENTS 60-149135  8/1985  Japan .

OTHER PUBLICATIONS

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by low–temperature rapid thermal annealing of amorphous silicon," *J. Appl. Phys.*, 65(5), Mar. 1, 1989, pp. 2069–72.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

*Primary Examiner*—T. Tung
*Attorney, Agent, or Firm*—Eric J. Robinson; Nixon Peabody LLP

[57] ABSTRACT

In etching using an etching solution, irradiating ultraviolet light is irradiated into a resist patterned on an etching substrate or a film formed on the etching substrate and then an etching solution is applied to the etching substrate while rotating the etching substrate. Also, ozone water is applied in contact with the resist and then an etching solution is applied to the etching substrate while rotating the etching substrate. In crystallization using a metal element such as nickel for promoting crystallization of silicon, irradiating ultraviolet light is irradiated into a resist patterned on an substrate or a film formed on the substrate and then a nickel solution is applied to the substrate while rotating the substrate. Also, ozone water is applied in contact with the resist and then the nickel solution is applied to the substrate while rotating the substrate.

11 Claims, 6 Drawing Sheets

SOLUTION APPLYING METHOD

BACKGROUND OF THE INVENTION

1. Field of the Invention

The present invention relates to a solution applying apparatus and a solution applying method used for a technique for applying a solution, such as wet etching, in a forming technique for a semiconductor device.

2. Description of the Related Art

Processes for applying a solution to a substrate are often performed when manufacturing semiconductor devices such as thin film transistors (TFTs) in which thin films of semiconductor, insulator and metal or the like are laminated and formed on a semiconductor substrate or glass substrate, such as semiconductor integrated circuits, active matrix type liquid crystal electro-optical devices and the like.

Commonly used solution applying methods include (1) a method for immersing (dipping) a substrate into a bath containing a solution in batch etching method or the like, (2) a method for applying a solution as a shower from a plurality of jets onto the upper surface of the substrate (a spray method), and (3) a method for applying a solution from a nozzle near the center of the rotating surface while the substrate is rotated (spin coating method).

The spin coating method (3) is suitable for so-called single wafer type processing with which it is possible to treat substrates uniformly, one at a time. However, in the method (3), since the substrate is rotated at 100 to 1000 rpm, a solution which is caused to drop or flow onto the rotating surface near the center moves at high speed toward the outside of the rotating surface. Therefore the moving speed of the solution on the substrate is much higher than the methods (1) and (2). That is, the method (3) has good solution circulation. Further, the moving speed of the solution at the peripheral portion of the rotating surface is higher than at the center portion of the rotating surface because of centrifugal force.

Conventionally, the following problems occurs due to the above fact. When spin etching is performed using an etching solution which has a large contact angle with respect to the resist, for example, hydrofluoric acid based etching solutions in a wet etching process, the etching solution does not adequately wet the surface to be etched, so that the etching solution forms balls and flows off. As a result, island-shaped etching irregularities form over the entire surface of the substrate. In particular, when aluminum mixed acid based etching solution is used, a portion which is not etched remains at the peripheral portion.

Thus the phenomenon occurs that etching is performed nonuniformly within a single substrate surface. This phenomenon becomes more marked as the fineness of the resist pattern width progresses. That is, since an etching solution does not penetrate uniformly into the fine portion, solution circulation is liable to be unsatisfactory.

Further, the phenomenon becomes more marked as the area of the substrate increases. In other words, if the area of the substrate increases, contact between the etching solution and the surface of the substrate is liable to be nonuniform. Also, irregularities also occur in the spray method (2).

In a liquid crystal display device, since several hundred thousand thin film transistors (TFTs) are formed on a single substrate such as quartz or glass in the same process, defect of one TFT causes defect of a substrate. Therefore, irregularity of the above etching causes a decrease in yield.

Also, a technique for selectively crystallizing an amorphous semiconductor material using a catalytic action of a metal element in producing a TFT using a resist (mask) is disclosed by Japanese Patent Published Application No. 6-319167. In the technique, a resist (mask) is formed on an amorphous silicon film, and then a solution containing a metal element such as nickel is added (applied). As a result, in an opening of a photoresist (mask), the metal element is selectively in contact with the surface of the amorphous silicon film. In this state, by heating with thermal annealing or laser light irradiation, the amorphous silicon film is crystallized from a region which the metal element is in contact with.

However, if the solution containing a metal element is uniformly added, since an amorphous silicon film is not crystallized sufficiently, characteristics of elements on the same substrate are different from each other.

Conventionally, in order to uniformly add (apply) a solution containing a metal element, an extremely thin oxide film is formed on the surface of an amorphous silicon film, so that wetting degree of the amorphous silicon film increases, or an interface active agent is added to the solution. However, this increases the number of process steps necessary to form the device.

SUMMARY OF THE INVENTION

An object of the present invention is to solve the above problems, and to provide a solution applying (adding) apparatus and method for uniformly applying a solution to a substrate on which a photoresist is formed, with good solution circulation, in a solution applying method such as spin coating in which the solution moves on the substrate at a high speed and has good solution circulation.

An object of the present invention is to provide a solution applying apparatus and method for uniformly applying a solution using a desired solution applying (dropping or flowing) method, in a solution applying method such as spin etching in which an etching solution moves on an etching surface at a high speed and has good solution circulation.

In order to solve the above problems, one invention disclosed in the specification is a solution applying apparatus having means for applying an etching solution uniformly to an etching substrate on which a patterned resist is formed or a film formed on the etching substrate.

Another invention disclosed in the specification is a solution applying apparatus having, means for irradiating ultraviolet light to a resist patterned on an etching substrate or a film formed on the etching substrate and means for applying an etching solution to the etching substrate.

Another invention disclosed in the specification is a solution applying apparatus having, means for irradiating ultraviolet light to a resist patterned on an etching substrate or a film formed on the etching substrate, means for applying an etching solution to the etching substrate, and means for rotating the etching substrate.

Another invention disclosed in the specification is a solution applying apparatus having, means for applying ozone water in contact with a resist patterned on an etching substrate or a film formed on the etching substrate and means for applying an etching solution to the etching substrate.

Another invention disclosed in the specification is a solution applying apparatus having, means for applying ozone water in contact with a resist patterned on an etching substrate or a film formed on the etching substrate, means for applying an etching solution to the etching substrate, and means for rotating the etching substrate.

Another invention disclosed in the specification is a solution applying method having the steps of, irradiating ultraviolet light to a resist patterned on an etching substrate or a film formed on the etching substrate and then applying an etching solution to the etching substrate.

Another invention disclosed in the specification is a solution applying method having the steps of, irradiating ultraviolet light to a resist patterned on an etching substrate or a film formed on the etching substrate and then applying an etching solution to the etching substrate while rotating the etching substrate.

Another invention disclosed in the specification is a solution applying method having the steps of, applying ozone water in contact with a resist patterned on an etching substrate or a film formed on the etching substrate and then applying an etching solution to the etching substrate.

Another invention disclosed in the specification is a solution applying method having the steps of, applying ozone water in contact with a resist patterned on an etching substrate or a film formed on the etching substrate and then applying an etching solution to the etching substrate while rotating the etching substrate.

Another invention disclosed in the specification is a solution applying apparatus having, a substrate positioning unit having means for irradiating ultraviolet light to a substrate to be etched, a spin etching unit, and a robot arm for transferring the substrate from the substrate positioning unit to the spin etching unit.

Another invention disclosed in the specification is a solution applying apparatus having, means for rotating a substrate and means for applying an etching solution to a surface of one of the substrate and a film to be formed on the substrate using a resist patterned on the surface while rotating the substrate, wherein the etching solution is applied to an entire upper surface of the substrate.

Another invention disclosed in the specification is a solution applying apparatus having, means for rotating a substrate and means for applying an etching solution to a surface of one of the substrate and a film to be formed on the substrate using a resist patterned on the surface while rotating the substrate, wherein the applying means has an etching solution outflow portion which moves over and in parallel to the surface while applying the etching solution, and the etching solution outflow portion passes through a substantially rotation center portion of the substrate.

Another invention disclosed in the specification is a solution applying apparatus having means for rotating a substrate and means for applying an etching solution to a surface of one of the substrate and a film to be formed on the substrate using a resist patterned on the surface while rotating the substrate, wherein the applying means has an etching solution outflow portion which moves over and in parallel to the surface while applying the etching solution, and the etching solution outflow portion passes through a substantially rotation center portion of the substrate and a moving trace of the etching solution outflow portion has an arc shape.

Another invention disclosed in the specification is a solution applying apparatus having, means for rotating a substrate, and means for applying an etching solution to a surface of one of the substrate and a film to be formed on the substrate using a resist patterned on the surface while rotating the substrate, wherein the applying means simultaneously applies to the etching solution in at least a range of from a rotation center portion of the substrate to an outermost portion.

Another invention disclosed in the specification is a solution applying apparatus having means for applying a solution including a metal element uniformly to a substrate on which a patterned resist is formed or a film formed on the substrate.

Another invention disclosed in the specification is a solution applying apparatus having, means for irradiating ultraviolet light to a resist patterned on a substrate or a film formed on the substrate and means for applying a solution including a metal element to the substrate.

Another invention disclosed in the specification is a solution applying apparatus having, means for irradiating ultraviolet light to a resist patterned on a substrate or a film formed on the substrate, means for applying a solution including a metal element to the substrate, and means for rotating the substrate.

Another invention disclosed in the specification is a solution applying apparatus having, means for applying ozone water in contact with a resist patterned on a substrate or a film formed on the substrate and means for applying a solution including a metal element to the substrate.

Another invention disclosed in the specification is a solution applying apparatus having, means for applying ozone water in contact with a resist patterned on a substrate or a film formed on the substrate, means for applying a solution including a metal element to the substrate, and means for rotating the substrate.

Another invention disclosed in the specification is a solution applying method having the steps of, irradiating ultraviolet light to a resist patterned on a substrate or a film formed on the substrate and then applying a solution including a metal element to the substrate.

Another invention disclosed in the specification is a solution applying method having the steps of, irradiating ultraviolet light to a resist patterned on a substrate or a film formed on the substrate and then applying a solution including a metal element to the substrate while rotating the substrate.

Another invention disclosed in the specification is a solution applying method having the steps of, applying ozone water in contact with a resist patterned on a substrate or a film formed on the substrate and then applying a solution including a metal element to the substrate.

Another invention disclosed in the specification is a solution applying method having the steps of, applying ozone water in contact with a resist patterned on a substrate or a film formed on the substrate and then applying a solution including a metal element to the substrate while rotating the substrate.

Another invention disclosed in the specification is a solution applying apparatus having, a substrate positioning unit having means for irradiating ultraviolet light to a substrate, a spin coating unit, and a robot arm for transferring the substrate from the substrate positioning unit to the spin coating unit.

Another invention disclosed in the specification is a solution applying apparatus having, means for rotating a substrate and means for applying a solution including a metal element to the substrate or a film to be formed on the substrate using a patterned resist while rotating the substrate, wherein the solution is applied to an entire upper surface of the substrate within a desired time.

Another invention disclosed in the specification is a solution applying apparatus having, means for rotating a substrate and means for applying a solution including a metal element to the substrate or a film to be formed on the substrate using a patterned resist while rotating the substrate, wherein the applying means has a solution outflow portion which moves over and in parallel to a surface of the substrate while applying the solution, and the solution outflow portion passes through a substantially rotation center portion of the substrate.

Another invention disclosed in the specification is a solution applying apparatus having means for rotating a substrate and means for applying a solution including a metal element to the substrate and a film to be formed on the substrate using a patterned resist while rotating the substrate, wherein the applying means has a solution outflow portion which moves over and in parallel to a surface of the substrate while applying the solution, and the solution outflow portion passes through a substantially rotation center portion of the substrate and a moving trace of the solution outflow portion has an arc shape.

Another invention disclosed in the specification is a solution applying apparatus having, means for rotating a substrate, and means for applying a solution including a metal element to the substrate and a film to be formed on the substrate using a patterned resist while rotating the substrate, wherein the applying means simultaneously applies to the solution in at least a range of from a rotation center portion of the substrate to an outermost portion.

In general, the contact angle of an etching solution with respect to the resist is reduced by irradiating ultraviolet light to the hardened resist for a desired period, or bringing it into contact with ozone water (water in which ozone ($O_3$) has dissolved at 0.1 to 20 ppm), so that a wetting degree of the etching solution is greatly increased.

The present invention makes use of this phenomenon, and before applying the solution, ultraviolet light is irradiated to the patterned and hardened resist which is formed on the substrate, or the resist is brought in contact with ozone water. It is thus possible to perform uniform etching without irregularities within a single substrate surface, even using an etching solution with a large contact angle, in an etching method in which the moving speed of the etching solution over the surface to be etched is fast, for example, spin etching.

Further, even with fine patterns in which the pattern width is of the order of several μm or less, since an etching solution penetrates adequately between the resists forming the pattern, uniform etching is possible.

It is even possible to prevent the occurrence of etching irregularities when the substrate is large.

The cause of the increased wetting of the applied etching solution resulting from ultraviolet light irradiation or ozone water processing may result from the following. That is, by ultraviolet light irradiation and ozone water contact to the hardened resist, an organic substance (or an organic contamination) on the surface of the resist is decomposed and removed and simultaneously the surface of the resist is activated, so that a surface energy of the resist decreases and a contact angle to a solution becomes small. Ultraviolet light irradiation is more effectively performed in an oxygen atmosphere since reactivity with an organic substance is increased.

The result that the contact angle of a solution becomes small by ultraviolet light irradiation or ozone water contact to the hardened resist is exhibited temporarily, and after that, the contact angle once again increases after a desired time.

The time during which the contact angle is decreased varies depending on the ultraviolet light irradiation time or the contact time with ozone water, the intensity of the ultraviolet rays (ultraviolet light), and the ozone concentration of the ozone water, but in air it is several minutes to several hours. It is therefore desirable to perform the ultraviolet light irradiation process or the ozone water contact process immediately before applying a solution.

Further, in spin etching, as a method for uniformly etching, other than irradiating the resist with ultraviolet light or bringing it into contact with ozone water, there is an improved method in which an etching solution is applied within a desired period onto the upper surface of an etching substrate having a resist or a resist on a film, in such a way that the etching solution drops or flows over the entire upper surface of the etching substrate which is rotating.

In comparison with a case wherein an etching solution is caused to drop or flow only near the center of the rotating surface of the substrate, in the above method, an etching solution is uniformly applied so that etching is performed uniformly.

Specifically, the etching solution outflow port (tip) of the nozzle which causes an etching solution to drop or flow moves in a direction parallel to the surface of the substrate, so that the etching solution is caused to drop or flow over the entire surface of the substrate.

Alternatively, an etching solution may be caused to flow or drop simultaneously over at least a range from the center of rotation of an etching substrate to the periphery thereof in the form of a shower. In other words, since an etching solution is caused to drop or flow (apply) onto the entire surface of the substrate, due to at least one rotation of the substrate, the etching solution is applied uniformly.

By adding an ultraviolet light irradiation process or a process in which ozone water is brought into contact, before the process in which the etching solution is applied, the etching solution is performed even more uniformly.

DETAILED DESCRIPTION OF THE PREFERRED EMBODIMENTS

Embodiment 1

In the embodiment, a process in which ultraviolet light is irradiated is performed before the etching process in the manufacture of a P channel-type pixel thin film transistor (TFT) used in an active matrix type liquid crystal electro-optical device. FIGS. 1A to 1F show the forming processes of the P-channel type pixel TFT in the embodiment.

Figure 1A:
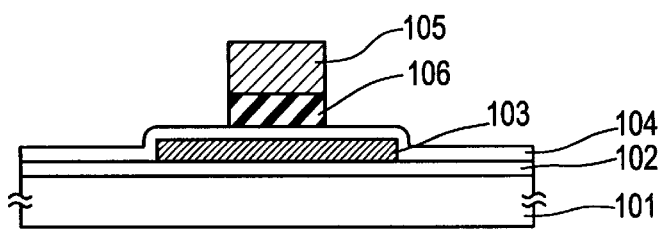
FIGS. 1A to 1F show the thin film transistor forming processes in an embodiment of the present invention.

In FIG. 1A, a silicon oxide film is formed to a thickness of 3000 Å by sputtering as a base film 102 on a glass substrate 101 (Corning #7059, 100 mm×100 mm). An amorphous silicon film is then formed to a thickness of 500 Å by plasma CVD, and then crystallization is performed by the thermal annealing in a nitrogen atmosphere for 12 hours at 600° C. Further, laser annealing is performed to improve crystallization. The energy density of the laser is suitably 250 to 350 mJ/cm², in the embodiment, 300 mJ/cm².

An island-like silicon film 103 is formed by patterning the crystallized silicon film. The silicon film 103 forms the active layer of the TFT. A silicon oxide film is formed to a thickness of 1000 Å by sputtering as a gate insulating film 104 to cover the island-like silicon film 103.

After this, an aluminum film with a thickness of 6000 Å is formed by low pressure CVD. A photoresist (in this case OFPR-800 (30 cp) manufactured by the Tokyo Ohka company) is applied to the upper surface of the aluminum film by spin coating. This is sub-sintered at 90° C., exposed to light, developed, main-sintered, and patterned, thereby forming a hardened photoresist 105.

The substrate 101 is then introduced into a chamber of a spin etching apparatus chamber to perform ultraviolet light irradiation and etching of the aluminum film, so that a gate electrode 106 is formed. It is preferable to move the substrate 101 using a conveying unit such as a robot arm.

A description will be given relating to the spin etching apparatus in FIG. 2.

The substrate 101 is held onto a stage 201 by a vacuum chuck. The stage 201 is connected to a motor (not shown), and is rotated by it.

An ultraviolet light irradiating source 200 is arranged into the chamber. The ultraviolet light source should irradiate light at a wavelength of 400 nm or less. In this embodiment, a 365 mm high pressure mercury lamp is used.

The substrate 101 is introduced into the chamber, and then held onto the vacuum chuck. Further, ultraviolet light is irradiated into a photoresist (mask) 105 from the ultraviolet light irradiating source 200. The irradiation time is 5 to 180 seconds, in this case 60 seconds. The output is 3 mW/cm² on the substrate 101.

By the ultraviolet light irradiation, the contact angle of the etching solution with respect to the surface of the photoresist is changed from approximately 30° (prior to ultraviolet light irradiation after washing with pure water) to approximately 4° (after ultraviolet light irradiation), and thus the contact angle is greatly reduced. This represents by the fact that the surface energy of the surface of the photoresist is reduced by the ultraviolet light irradiation. The contact angle of the etching solution with respect to the surface to be etched is measured by placing the substrate at rest horizontally in a room with a constant temperature of 25° C., and dropping a single droplet of the etching solution onto the surface using a syringe.

Next, a first nozzle 203 is moved to the vicinity of the center of the upper surface of the substrate 101, and then allows an etching solution to flow in the center portion while the substrate 101 is rotating. An etching solution which is allowed to flow onto the substrate 101 is moved toward the outside of the substrate 101 by the centrifugal force due to the rotation of the stage 201, and it flies off to the cap 202. The etching solution on the cap 202 collects in a waste solution tank (not shown) through a waste solution opening 205.

Here, 45° C. aluminum mixed acid (phosphoric acid+ acetic acid+nitric acid) is caused to flow from the first nozzle 203 as the etching solution, and etching is performed for 4 minutes while the substrate 101 is rotated at 500 rpm. The etching rate is 1500 Å/minute.

After etching, A second nozzle 204 is used to cause pure water to flow onto the center of the upper surface of the substrate 101 which is rotating, thereby cleaning the upper surface of the substrate 101. Before etching, the substrate may be cleaned by the same manner.

Also, after etching, a gate electrode 106 is formed. At this time, etching is performed uniformly in the surface of the substrate 101. (FIG. 1A).

When etching is performed under the same condition except for (without) ultraviolet light irradiation, a number of regions in which etching is not performed sufficiently are present in an island form. In particular, a number of regions in which etching is not performed sufficiently are present in a peripheral (outside) portion.

When the etching process is completed, the substrate 101 is taken out from the spin etching apparatus, to anodize the gate electrode 106.

Figure 1B:
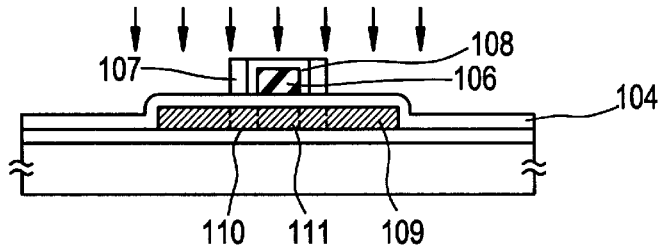

In FIG. 1B, a porous anodic oxide 107 is formed to a thickness of 0.1 to 1 μm, in this case 0.5 μm, on the side surface of the gate electrode 106 using a 3% sulfuric acid solution, without removing the photoresist (mask) 105. Also, after the photoresist 105 is removed, using an ethylene glycol solution containing 3 to 10% of tartaric acid, boric acid and phosphoric acid, neutralized to a pH of approximately 7 with ammonia, a fine anodic oxide 108 is formed to a thickness of 1500 Å on the side surfaces and the upper surface of the gate electrode 106.

Boron is then implanted in the island-like silicon film 103 as an impurity by ion doping, using the gate electrode 106 and the anodic oxides 107 and 108 as masks, to form the active layer of the semiconductor in a self-alignment. The dose is $1 \times 10^{15}$ to $8 \times 10^{15}$ atoms/cm², and the acceleration voltage is 40 to 80 kV, for example, the dose is $5 \times 10^{15}$ atoms/cm², and the acceleration voltage is 65 kV. As a result, a P-type impurity region (source/drain regions) 109 and an intrinsic region 111 (channel region) with an offset region 110 in which the concentration of the P-type impurity is extremely low are formed. It is possible to reduce the leak current by the offset region when the device is turned off. (FIG. 1B).

The porous anodic oxide is etched using a mixture of phosphoric acid, acetic acid and nitric acid. Only the porous anodic oxide 107 is etched by this etching, and a fine anodic oxide 108 remains. The etching rate is approximately 600 Å/minute.

The impurity ions implanted in the active layer are activated by irradiating with a KrF excimer laser (wavelength of 248 nm, pulse width of 20 nsec).

After this, a silicon nitride film is formed as an interlayer insulating film 112 to a thickness of 3000 Å over the entire surface by plasma CVD.

Figure 1C:
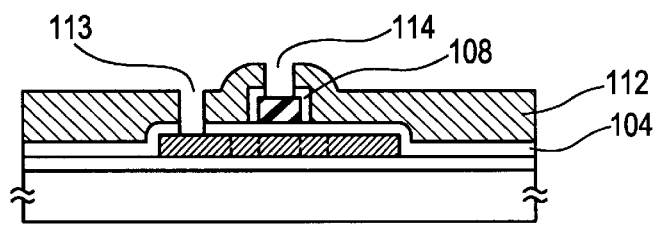

In FIG. 1C, a photoresist (mask) which is patterned and sintered is formed on the upper surface of the interlayer insulating film 112. Using this mask, the interlayer insulating film 112 is etched, the gate insulating film 105 and the anodic oxide 107, to form contact holes 113 and 114.

Ultraviolet light irradiation is performed on the photoresist (mask) in the same way as in the forming process of the gate electrode 106, to increase a wetting degree of the photoresist (mask). After that, the substrate is moved to the spin etching apparatus of FIG. 2, to perform spin etching.

Etching is performed on the interlayer insulating film 112 including silicon nitride, and the gate insulating film 104 including silicon oxide. Here, buffered hydro-fluoric acid (BHF) ($NH_4F:HF=10:1$) is caused to flow from the first nozzle 203 as an etching solution, and etching is performed for 4 minutes with the substrate 101 rotating at 500 rpm. The etching rate is approximately 1000 Å/minute.

After etching, while the substrate 101 is rotated, it is washed with pure water applied from the second nozzle 204.

Figure 2:
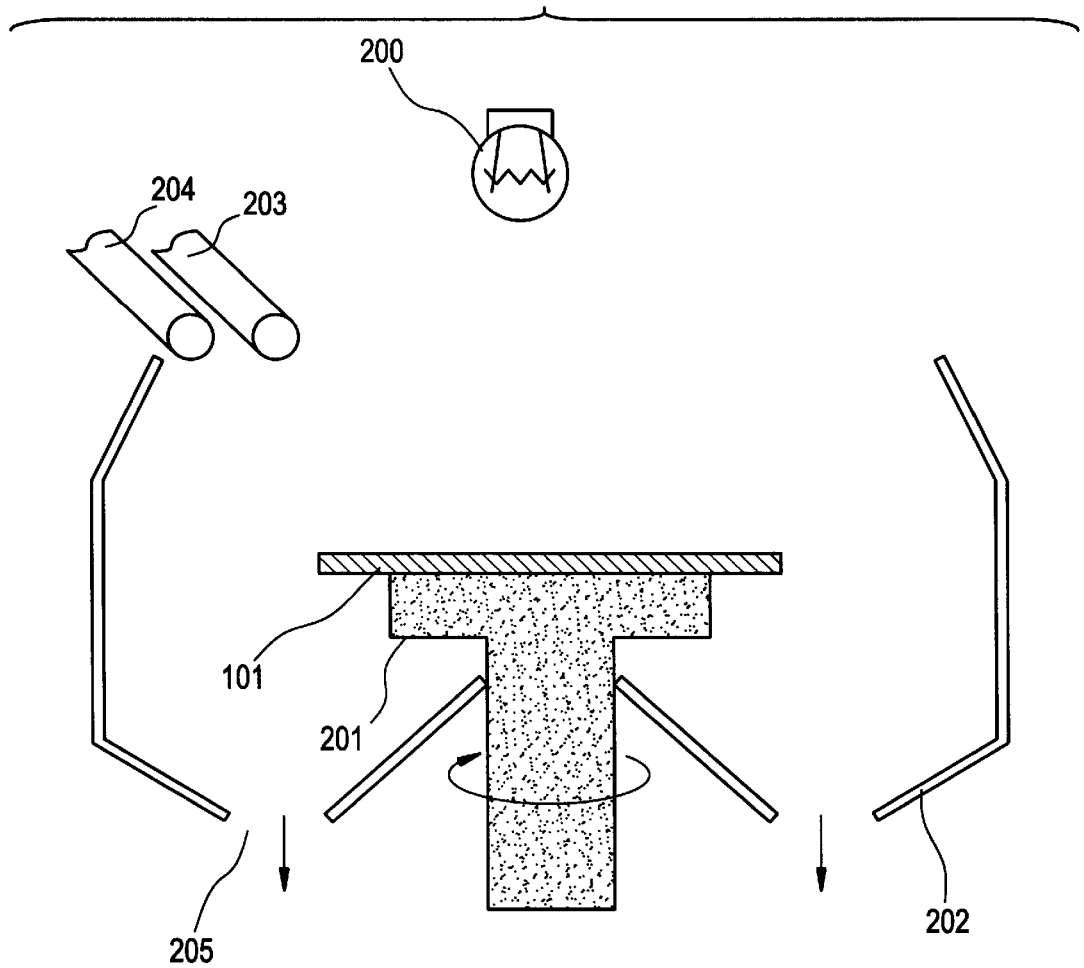
FIG. 2 shows a spin etching apparatus.

Further, the substrate is moved to a chamber of another apparatus having the same construction as that in FIG. 2, to etch the fine anodic oxide 108. If necessary, it is also possible to perform ultraviolet light irradiation to the photoresist (mask) before etching.

Here, an aqueous mixture of 3% phosphoric acid plus 3% anhydrous chromic acid, heated to 70°, is used as the etching solution, and etching is performed for 4 minutes with the substrate rotating at 500 rpm. The etching rate is 40 Å/minute. After etching, the substrate is washed with pure water. In this way, contact holes 113 and 114 are formed in the source region and the gate electrode region through two etching processes (FIG. 1C).

Figure 1D:
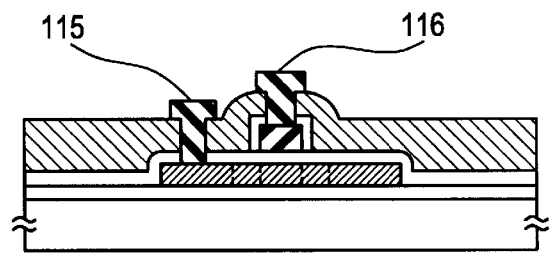

Further, an aluminum film is formed to a thickness of 6000 Å by sputtering, and in the same way as the process whereby the gate electrode 106 is formed, the photoresist (mask) is subjected to ultraviolet light irradiation. After this, spin etching for the aluminum film is performed to form a source electrode 115 and a gate electrode 116. The conditions in this case are the same as for the etching of the gate electrode 106 (FIG. 1D).

Figure 1E:
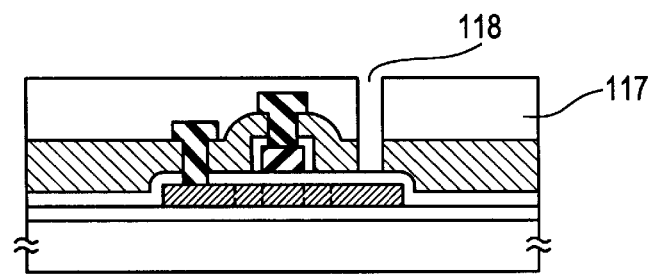

A silicon oxide film is then formed to a thickness of 2000 Å by plasma CVD as a passivation film 117. A resist is applied onto the passivation film 117, patterned and sintered, to form an etching mask. Using this mask, etching is performed on the passivation film 117, the interlayer insulating film 112 and the gate insulating film 104. Buffered hydrofluoric acid (BHF) ($NH_4F:HF=10:1$) is used as the etching solution, and spin etching is performed after ultraviolet light irradiation. The etching time is 6 minutes, the etching rate is approximately 1000 Å/minute and the speed of rotation is 500 rpm. A washing process is then performed in the same way. In this way, a contact hole 118 is formed. (FIG. 1E).

Figure 1F:
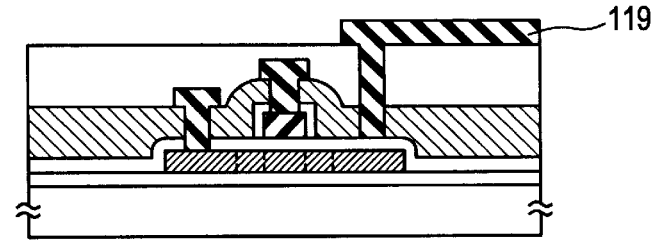

Further, ITO film is formed to a thickness of 800 Å by sputtering and then a photoresist (mask) is formed. Further, ultraviolet light irradiation is performed in the same way, and then spin etching is performed. The etching solution is ITO mixed acid ($HCl:H_2O:HNO_3=1:1:0.03$). The etching time is 0.5 minutes, the etching rate is 1600 Å/minute and the speed of rotation is 500 rpm. A washing process is then performed in the same way. By etching in this way, a contact hole is formed, a pixel electrode 119 is formed and a pixel TFT is thus produced. No etching irregularities appear in any of the etching processes. (FIG. 1F)

An ultraviolet light irradiation process to a photoresist (mask) may be added before the pure water washing process in the embodiment. In this way, since wetting degree of the photoresist (mask) is increased, it is possible to perform pure water washing more effectively. Also, it is also possible to provide an ultraviolet light source such as a high pressure mercury lamp within the chamber of the spin etching apparatus of FIG. 2, and to perform etching and ultraviolet light irradiation within the same chamber. Further, by increasing the number of nozzles, it is possible to cause a plurality of etching solutions to flow from a plurality of nozzles, and it is therefore possible to perform different types of etching continuously within the same chamber.

Embodiment 2

Figure 3:
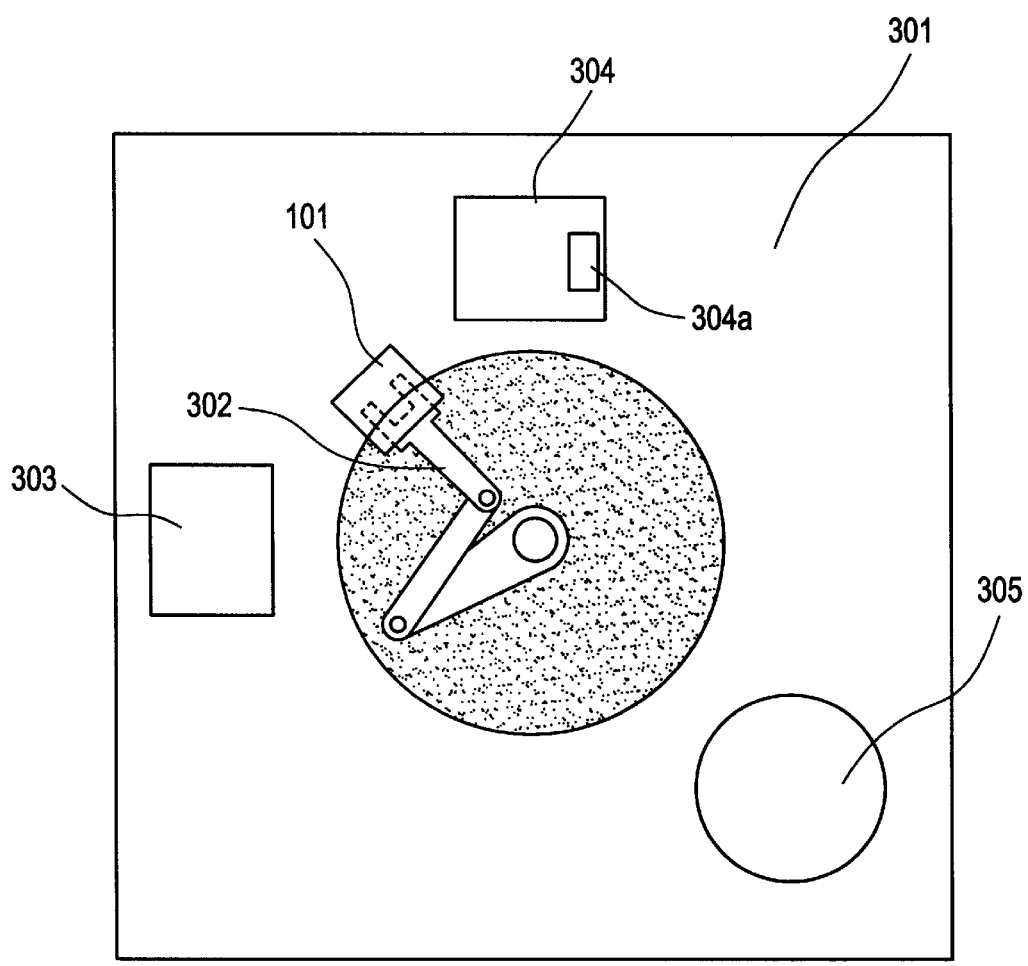
FIG. 3 shows a single wafer processing system in which a spin etching apparatus and other apparatus have integrated.

The embodiment is an example of a spin etching system in which a spin etching apparatus and other apparatuses are provided integrally, as shown in FIG. 3. A robot arm 302 for moving the substrate 101 is provided at the center on a main body 301. A cassette 303 which houses a plurality of substrates 101, a substrate positioning (alignment) unit 304 and a spin etching apparatus 305 are provided such that they surround the robot arm 302. An ultraviolet light irradiating unit 304a such as a high pressure mercury lamp which irradiates ultraviolet light from the top is provided in the positioning unit 304, and therefore ultraviolet light can be irradiated at the same time as positioning is effected, and therefore the process is simplified.

In FIG. 3, a first nozzle which causes an etching solution to flow, and a second nozzle which causes pure water to flow for washing are provided in the spin etching apparatus 305, and thus washing, etching and drying (spin drying) can be performed within the same chamber.

Further, a washing chamber and chambers for performing different types of etching may be provided on the main body, and treatment performed in each chamber.

Embodiment 3

The embodiment is an example of processes in which ozone water is brought into contact with the resist prior to the etching process, and in which a P channel-type pixel TFT, as used in an active matrix type liquid crystal electro-optical device, is formed. The manufacturing process for the P-channel type pixel TFT of the embodiment is shown in FIGS. 1A to 1F.

In FIG. 1A, a silicon oxide film is formed to a thickness of 3000 Å by sputtering as a base film 102 on a glass substrate 101 (Corning #7059, 100 mm×100 mm). An amorphous silicon film is then formed to a thickness of 500 Å by plasma CVD, and then which crystallization is performed by the thermal annealing in a nitrogen atmosphere for 12 hours at 600° C. Further, laser annealing is performed to improve crystallization. The energy density of the laser is suitably 250 to 350 mJ/cm$^2$, in the embodiment 300 mJ/cm$^2$.

An island-like silicon film 103 is formed by patterning the crystalline silicon film formed in this way. The island-like silicon film 103 forms the active layer of the TFT. A silicon oxide film is formed to a thickness of 1000 Å by sputtering as a gate insulating film 104 to cover the island-like silicon film 103.

After this, an aluminum film with a thickness of 6000 Å is formed by low pressure CVD. A photoresist (in this case OFPR-800 (30 cp) manufactured by the Tokyo Ohka company) is applied to the upper surface of the aluminum film by spin coating, sub-sintered at 90° C., exposed to light, developed, main-sintered, and patterned, to form a photoresist (mask) 105. Using the photoresist 105, the aluminum film is etched to form a gate electrode 106. (FIG. 1A)

In order to form the gate electrode 106, the substrate 101 is then introduced into a chamber provided with an ultraviolet light source, and then the photoresist 105 is irradiated with ultraviolet light for 5 to 180 seconds, in this case 60 seconds. The ultraviolet light source should irradiate light at a wavelength of 400 nm or less, and in this case a 365 mm high pressure mercury lamp is used. The output is 3 mW/cm$^2$ on the substrate 101.

Figure 7:
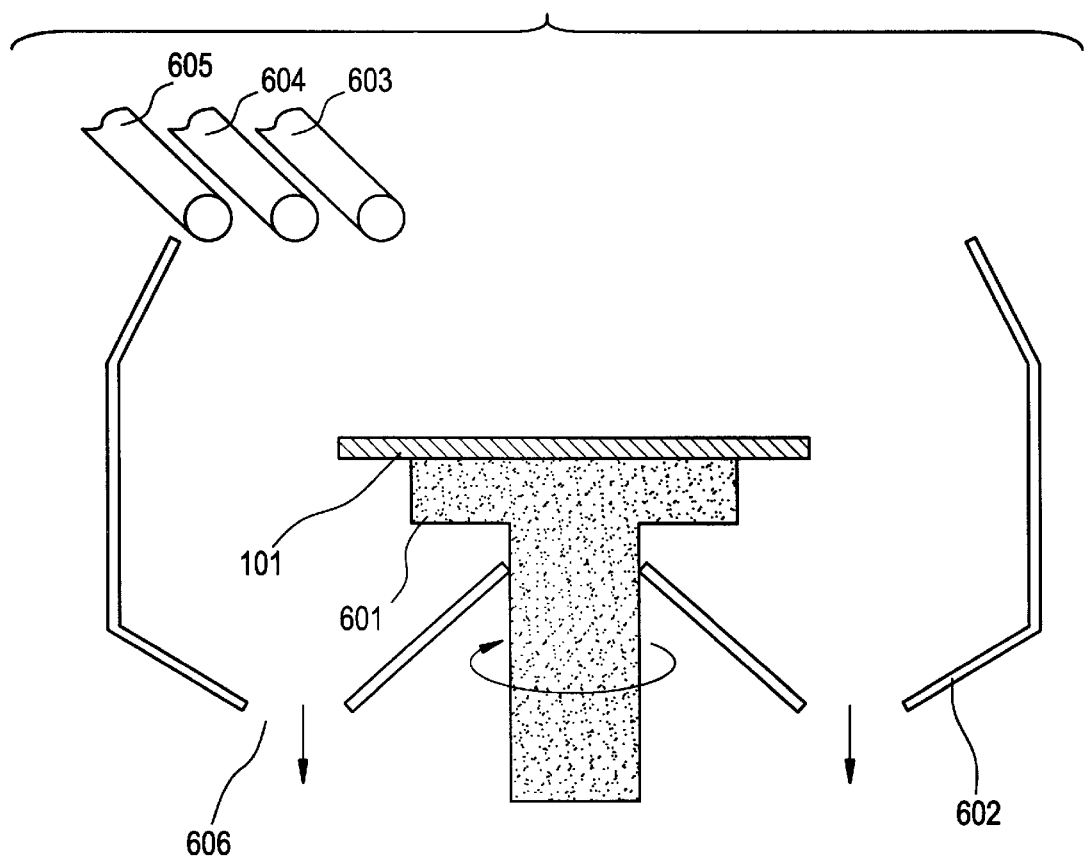
FIG. 7 shows a spin coating apparatus.

Immediately after the ultraviolet light irradiation, the substrate 101 is introduced into the spin etching system in FIG. 7. It is preferable to move the substrate 101 using a conveying unit such as a robot arm.

The substrate 101 is held on a stage 601 by a vacuum chuck. The stage 601 is connected to a motor (not shown) and rotated.

While the substrate 101 is rotating, the first nozzle 203 is moved close to the center on the surface of the substrate 101, and causes ozone water to flow toward the center of the upper surface of the substrate 101. A solution into which 0.1 to 20 ppm concentration of ozone is dissolved can be used as the ozone water, and here a solution in which 2 ppm of ozone is dissolved is used.

Ozone water applied on the substrate 101 is moved from an outside of the substrate 101 by centrifugal force due to rotation of the stage 601, so that it flies off to the cap 202.

The etching solution on the cap 202 collects in a waste solution tank (not shown) through a waste solution opening 606.

While the ozone water is allowed to flow from the first nozzle 603, the substrate 101 is rotated for 3 minutes at a speed of rotation of 3000 rpm, and ozone water comes into contact with the entire surface of the substrate 101. The speed of rotation is then set to 2500 rpm, and the ozone water on the substrate 101 is dried by spin dry.

The second nozzle 604 is moved to the center of the upper surface of the substrate, and causes etching solution to flow in the center of the upper surface of the substrate 101. Aluminum mixed acid (phosphoric acid+acetic acid+nitric acid) at 45° C. is used. Etching is performed while the substrate 101 is rotated for 4 minutes at a speed of 500 rpm. The etching rate is 1500 Å/minute.

After etching, a third nozzle 605 is moved to the center portion of rotation of the substrate 101 to cause pure water to flow.

The contact angle of the etching solution with respect to the photoresist surface is changed from approximately 30° (before the ozone water has flowed and after washing with pure water) into approximately 7° (after the ozone water has flowed), and thus the contact angle is greatly reduced by the contact with the ozone water. This represents by the fact that the surface energy of the photoresist surface is reduced by the contact of the ozone water with the resist surface. The contact angle with respect to the substrate surface is measured by accurately placing the substrate horizontally within a chamber at a constant temperature of 25° C., and dropping a single droplet of ozone water onto the substrate using a syringe.

After the etching process in this way, a gate electrode 106 is formed. At this time, etching is performed uniformly within the substrate surface. (FIG. 1A)

However, if etching is performed under the same conditions, except that the ozone water flow process is not performed, a large number of island-like regions exist in which etching is insufficient. In particular, there are a large number of regions at the periphery in which etching is etching is insufficient.

A porous anodic oxide 107 is then formed to a thickness of 0.1 to 1 $\mu$m, here 0.5 $\mu$m, on the side surfaces of the gate electrode 106 using a 3% sulfuric acid solution, without removing the photoresist (mask) 105. The photoresist 105 is then removed, and using an ethylene glycol solution containing 3 to 10% of tartaric acid, boric acid and phosphoric acid, which has neutralized to a pH of approximately 7 using ammonia, a fine anodic oxide 108 is formed to a thickness of 150Å on the upper surface and side surfaces of the gate electrode 106.

Boron is then implanted in a self-alignment as an impurity into the island-like silicon film 103 by ion doping, with the gate electrode 106 and the anodic oxides 107 and 108 as masks. The dose is $1\times10^{15}$ to $8\times10^{15}$ atom/cm$^2$, and the acceleration voltage is 40 to 80 kV, for example the dose is $5\times10^{15}$ atoms/cm$^2$, and the acceleration voltage is 65 kV. As a result, a P-type impurity region (source/drain regions) 109, and an intrinsic region 111 (channel region) with an offset region 110 in which the concentration of the P-type impurities is extremely low are formed. It is possible to reduce the leak current when the device is turned off, by the offset regions 110. (FIG. 1B).

After this, the porous anodic oxide 107 is etched using a mixture of phosphoric acid, acetic acid and nitric acid. Here, only the porous anodic oxide 107 is etched and the fine anodic oxide 108 remains. The etching rate is approximately 600 Å/minute.

Further, a KrF excimer laser (wavelength of 248 nm, pulse width of 20 nsec) is irradiated to activate the impurity ions introduced into the active layer.

After this, a silicon nitride film is formed to a thickness of 3000 Å by plasma CVD as an interlayer insulating film 112, over the entire surface.

A photoresist is patterned on the upper surface of the layer insulating film 112 and sintered, and then the interlayer insulating film 112, the gate insulating film 105 and the anodic oxide 107 are etched to form contact holes 113 and 114.

Figure 6:
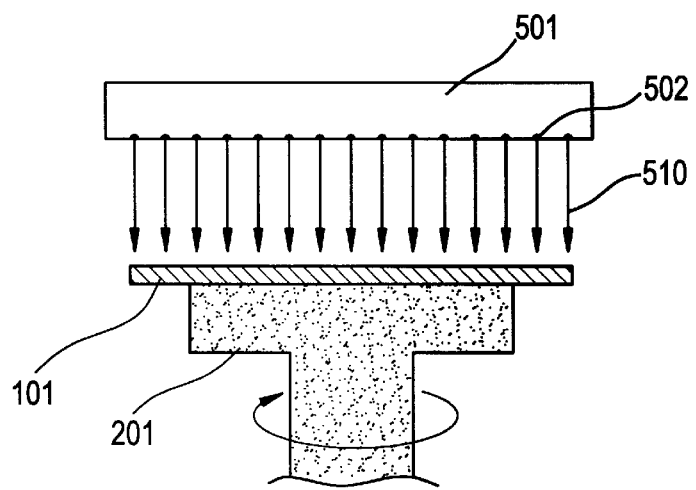
FIG. 6 shows another spin etching apparatus.

In order to form the contact holes 113 and 114, after the substrate is placed into the apparatus of FIG. 6 and ozone water is in contact with the resist, spin etching is performed.

Etching is performed to form contact holes in the interlayer insulating film 112 comprising silicon nitride, and the gate insulating film 105 comprising silicon oxide.

Ozone water is caused to flow from the first nozzle 603 in the same way as in the forming process of the gate electrode 106 and to be in contact with the photoresist (mask). Then, buffered hydrofluoric acid (BHF) (NH$_4$F:HF=10:1) is caused to flow from the second nozzle 604 as an etching solution, and etching is performed for 4 minutes with the substrate rotating at 500 rpm. The etching rate is 1000 Å/minute.

After etching, while rotating the substrate 101, pure water is caused to flow from the third nozzle 605, to wash the substrate 101. Also, the substrate 101 is moved to a chamber of another apparatus having the same construction as that in FIG. 6, and then the anodic oxide 108 is etched. Before this etching, ozone water may be in contact with the photoresist again. An aqueous mixture of 3% phosphoric acid plus 3% anhydrous chromic acid which has heated to 70° is used as the etching solution, and etching is performed for 4 minutes with the substrate rotating at 500 rpm. The etching rate is 400 Å/minute.

After etching, while rotating the substrate 101, washing is performed using pure water applied from the third nozzle 605. In this way contact holes 113 and 114 are formed in the source region and the gate region. (FIG. 1C)

In the embodiment, etching of the interlayer insulating film 112 and the gate insulating film 105 and etching of the anodic oxide 108 are performed in different etching apparatuses, respectively. However, By arranging a further nozzle in the etching apparatus of FIG. 6 and then applying different etching solutions, two etching processes may be performed in the same etching process.

An aluminum film is formed to a thickness of 6000 Å by sputtering, and a source electrode 115 and a gate electrode 116 are formed by ozone water flow and spin etching on the patterned photoresist in the same way as with the gate electrode outlined above. The conditions are the same as for the etching of the gate electrode 106 outlined above. (FIG. 1D)

After this, a silicon oxide film is formed to a thickness of 2000 Å by plasma CVD as a passivation film 117.

A resist is applied, patterned, sintered, and formed on the passivation film 117, and etching is performed on the passivation film 117, the interlayer insulating film 112 and the gate insulating film 104. Buffered hydrofluoric acid (BHF) (NH$_4$F:HF=10:1) is used as the etching solution, and after ozone water flow, spin etching is performed. The etching time is 6 minutes, the etching rate is 1000 Å/minute, and the rotation speed is 500 rpm. The washing process is then performed in the same way. In this way a contact hole 118 is formed. (FIG. 1E)

Further, an ITO film is formed to a thickness of 800 Å by sputtering, and after forming a photoresist, ozone water flow is performed in the same way, and spin etching is performed. The etching solution is ITO mixed acid (HCl:H$_2$O:HNO$_3$)= 1:1:0.03. The etching time is 0.5 minutes, the etching rate is 1600 Å/minute, and the rotation speed is 500 rpm. The washing process is then performed in the same way.

In this way, a pixel electrode 119 is formed by etching, and a pixel TFT is manufactured. No etching irregularities were seen in any of the etching processes. (FIG. 1F)

In the embodiment, it is also possible to add an ozone water flow process before the washing process using pure water. In this way, it is possible to perform washing by pure water more effectively.

In the embodiment, ozone water flow and spin etching may be performed in individual chambers, and they may be performed while the substrate is rotated. In the ozone water flow process, the substrate may not be rotated.

The method whereby wetting degree of the resist surface is improved by causing ozone water to flow can be achieved simply by increasing the number of nozzles in a conventional spin etching apparatus, or by altering the type of solution which is caused to flow, and therefore no novel design of apparatus or the like is required.

The ultraviolet light irradiation in the first embodiment and the ozone water flow of the present embodiment may also be combined.

By increasing the number of nozzles, it is possible to cause etching solution to flow from a plurality of nozzles, and it is therefore possible to perform different types of etching continuously within the same chamber.

Also, in FIG. 3, a first nozzle for applying ozone water, a second nozzle for applying an etching solution, a third nozzle for applying pure water for washing are arranged in the spin etching apparatus 305, and then in the same chamber, washing, ozone water applying, etching and dry (spin dry) are performed. In this state, the ultraviolet light irradiating source 304a of the positioning unit 304 may be not arranged.

A chamber for ozone water applying, a chamber for washing, a chamber for different types of etching and the like may be arranged in the main body 301, to perform processing in each chamber.

Embodiment 4

Figure 4:
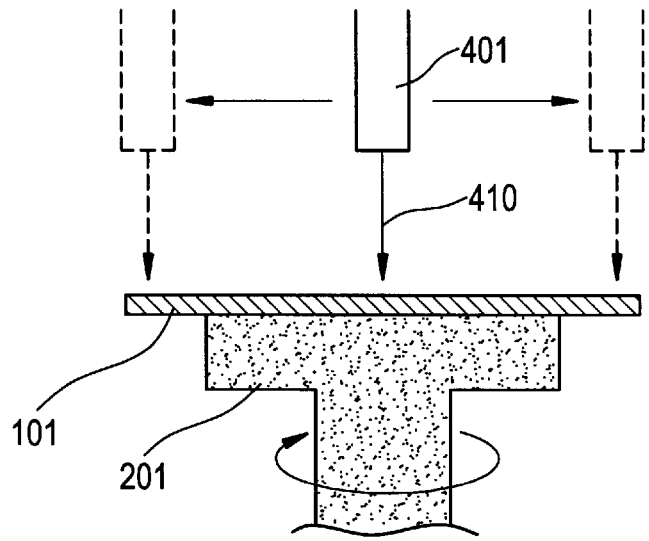
FIG. 4 shows another spin etching apparatus.
Figure 5:
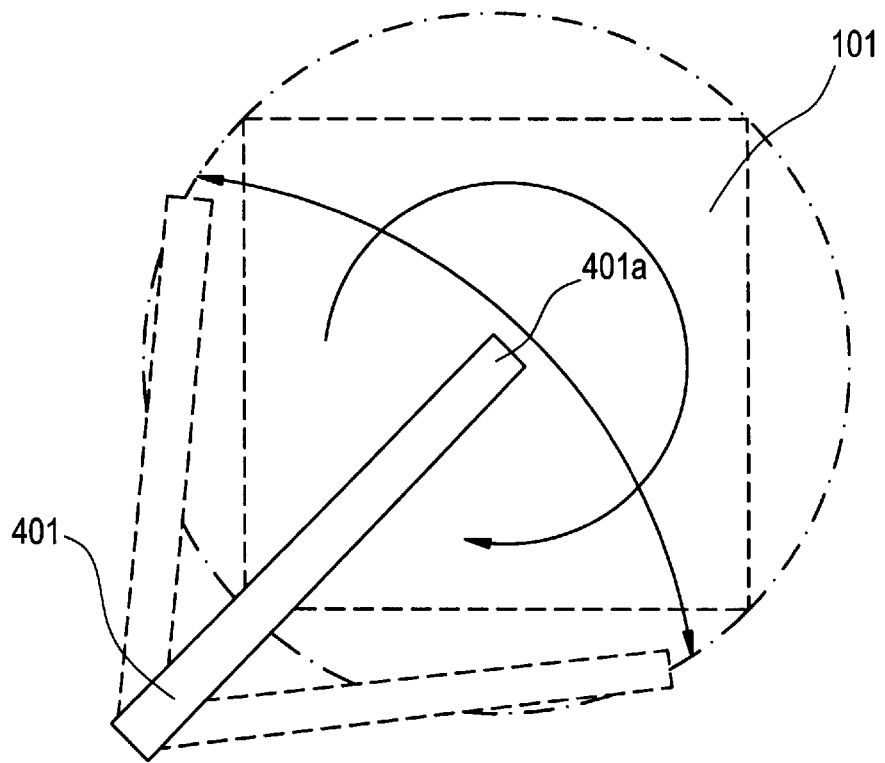
FIG. 5 is the upper view of the spin etching apparatus of FIG. 4.

FIG. 4 shows the spin etching apparatus of the embodiment, and FIG. 5 is a top view of FIG. 4. In Embodiment 4, as in Embodiments 1 to 3, the construction is not one in which etching solution is dropped or caused to flow only near the center of the substrate to be etched, but indicates construction in which etching solution is caused to drop and flow over the entire upper surface (rotating surface) of the substrate to be etched, which is rotated, within a desired period. The spin etching apparatus in FIGS. 4 and 5 is the same construction as that in FIG. 2, except for the nozzle for applying an etching solution.

In Embodiment 4, the spin etching apparatus of FIG. 4 is used, and as shown in FIG. 1A, a substrate 101 which is to be etched and on which a patterned hardened photoresist has been formed, is introduced into the spin etching apparatus and then etching is performed, as in Embodiment 1.

In FIG. 4, the substrate 101 is held to a stage 201 by a vacuum chuck. The stage 201 is connected to a motor, which is not shown, and is rotated. Etching solution 410 is caused to flow from above the rotating substrate by a nozzle 401.

In FIG. 5, the nozzle 401 which extends from the rotating surface of the substrate 101 oscillates to the left and right in a direction parallel to the surface of the substrate 101 while the etching solution outflow portion (in other words, the tip) 401a passes approximately through the center of the rotating surface of the substrate 101.

The nozzle 401 oscillates such that the locus (trace) of movement of the etching solution outflow portion 401a has an arc shape and passed through the center of rotation of the substrate 101, but it is also possible to attach the nozzle 401 to a linear motor or the like, and to oscillate such that its trace has a straight line.

In FIG. 5, when the nozzle 401 oscillates such that the locus of the outflow portion 401a has an arc shape, it is possible to move the outflow portion 401a of the nozzle 401 parallel to the rotating surface of the substrate 101 by an extremely simple construction.

Arrangements are made such that the nozzle 401 moves from one side of the periphery of the rotating surface to the other side in 0.5 to several seconds, depending on the surface area of the substrate 101, in order to cause etching solution to drop or flow onto the entire upper surface of the substrate 101. The range of movement of the nozzle 401 may be between the position indicated by the solid line passing through the center of the rotating substrate 101 and either of the positions shown by the dotted lines (for example on the right).

Using the spin etching apparatus in FIG. 4, the aluminum film formed on the substrate 101 is etched. 45° C. aluminum mixed acid (phosphoric acid plus acetic acid plus nitric acid) is caused to flow from the nozzle 401 as the etching solution, and etching is performed for 4 minutes with the substrate rotating at 500 rpm. The etching rate is 1500 Å/minute.

As a result, etching is performed uniformly within the surface of the substrate 101, and no regions of insufficient etching are seen.

Thus, in FIG. 4, even if an area of the substrate 101 is increased, it is possible to perform etching uniformly within the surface of the substrate, since, in comparison with a case in which etching solution is caused to drop or flow only at the center of the rotating surface of the substrate, etching solution is applied uniformly onto the substrate.

Embodiment 5

FIG. 6 shows another construction of the spin etching apparatus of the embodiment.

A linear etching outflow nozzle 601 is provided parallel to and above the rotating surface of the substrate 101. By a plurality of holes 502 provided in the nozzle 501, etching solution 610 is caused to drop and flow simultaneously onto the surface of the substrate 101, and is applied onto the substrate 101.

The width over which etching solution is caused to drop and flow by the nozzle 501 must be at least half of the length of the diagonal across the substrate. In this case, etching solution is applied uniformly over the entire upper surface of the substrate by one rotation of the substrate.

In FIG. 6, the nozzle 501 causes etching solution to drop and flow over the entire length of the diagonal across the substrate. Thus etching solution is applied uniformly over the entire upper surface of the substrate 101 by half a rotation of the substrate 101.

Even if spin etching is performed while etching solution is caused to flow in the form of a shower, it is possible to apply etching solution uniformly onto the upper surface of the substrate in the same way as the apparatus of FIG. 4. As a result, it is possible to perform uniform etching within the surface of the substrate.

When, before etching process, ultraviolet light irradiation or ozone water contact to the surface of a photoresist is performed, it is effective perform uniform etching within the surface of the substrate.

Embodiment 6

In the embodiment, a desired mask pattern is formed on the surface of an amorphous silicon film using a resist mask, and then a metal element such as nickel is introduced selectively into the amorphous silicon film by applying a solution containing the nickel from above the mask pattern.

Figure 8A:
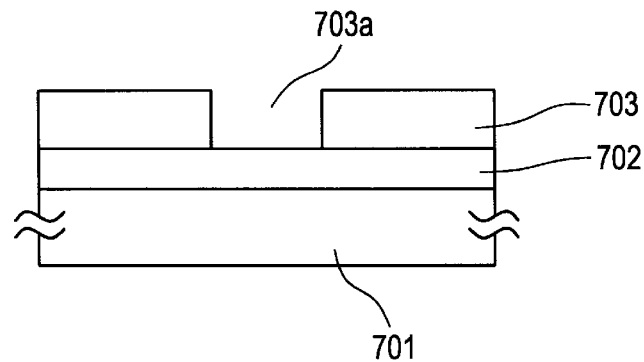
FIGS. 8A to 8C show crystallization processes of an amorphous silicon film.
Figure 8B:
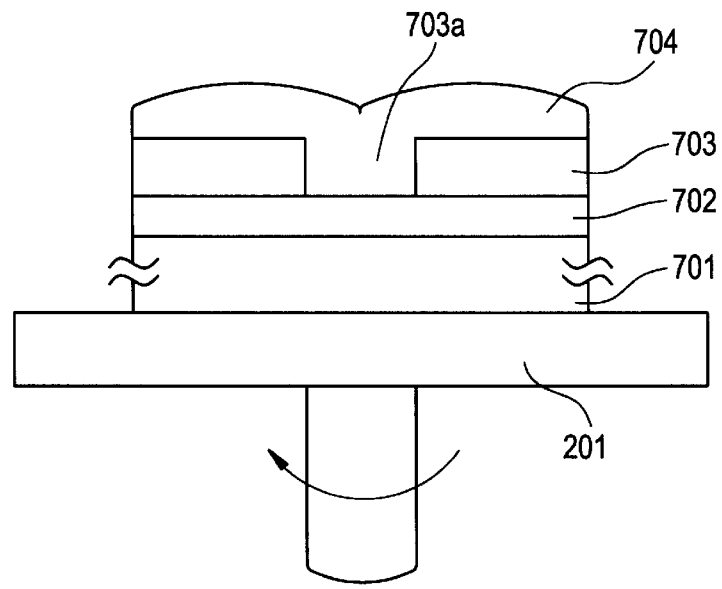
Figure 8C:
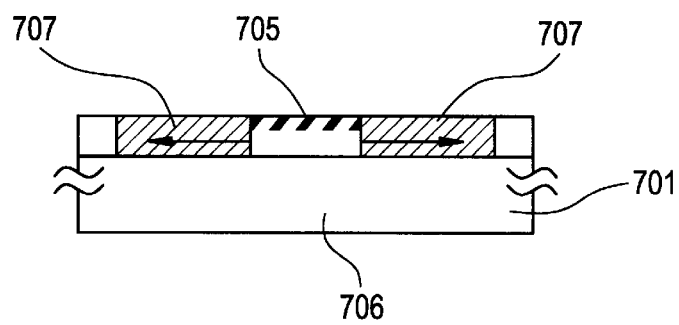

FIGS. 8A to 8C show forming processes in the embodiment. An amorphous silicon film 702 having a thickness of 500 Å is formed on a glass substrate 701 (Corning #7059, 10 cm×10 cm) by plasma CVD. A resist is formed on the surface of the film 702. The resist may be a positive or negative type. By commonly used photolithography patterning process, a resist mask 703 is patterned to a desired pattern. (FIG. 8A)

In this state, ultraviolet light is irradiated into the resist mask 703. In the embodiment, the ultraviolet light source is 365 nm high pressure mercury lamp. The output is set to 3 mW/cm$^2$ on the surface of the substrate 701. The irradiation time is set to about 5 to 180 seconds.

An acetate solution (5 ml) containing nickel of 100 ppm is applied in a case wherein the substrate has 10 cm×10 cm in size by using the apparatuses of FIGS. 4 to 6 as a spin coater.

While a stage 201 is rotated at a rotation speed of 50 rpm, a nickel acetate solution is applied (dropped) from a nozzle 401 (501), to perform spin coating for 10 seconds. Since ultraviolet light has irradiated into the resist mask 703 and therefore a contact angle to a solution becomes small, a film 704 is formed uniformly on the entire surface of the substrate 701.

After this state is maintained for 5 minutes, the stage 201 is rotated at a rotation speed of 2000 rpm, to performing spin dry. This state may be maintained while the stage 201 is rotated at a rotation speed of 0 to 150 rpm. (FIG. 8B)

When the resist mask 703 is removed by oxygen ashing, in an opening portion 703a, a region 705 which nickel element is adsorbed is formed selectively in the amorphous silicon film 702. The resist mask may be removed by annealing in an atmosphere including oxygen.

After that, the amorphous silicon film 702 is crystallized by heating treatment at 550° C. for 4 hours in an atmosphere including nitrogen. In the state, as shown in an arrow in FIG. 8C, crystal growth is performed from the region 705 into which nickel is introduced to a region into which nickel is not introduced, along a transverse direction. In FIG. 8C, numeral 706 represents a region into which nickel is introduced directly and which is crystallized, and numeral 707 is a region which is crystallized in a transverse direction.

After crystallization process by heating treatment, it is useful to perform annealing by irradiation of laser light or intense light. By this, crystallinity of a crystalline silicon film is further increased. KrF excimer laser and XeCl laser may be used as laser light. It is effective to use infrared light as intense light. Since infrared light is not absorbed easily by a glass substrate and absorbed selectively by silicon, large effect by annealing can be obtained.

Embodiment 7

In the embodiment, a desired mask pattern is formed on the surface of an amorphous silicon film using a resist mask, and then a metal element such as nickel is introduced selectively into the amorphous silicon film by applying a solution containing the nickel from above the mask pattern.

FIGS. 8A to 8C show forming processes in the embodiment. An amorphous silicon film 702 having a thickness of 500 Å is formed on a glass substrate 701 (Corning #7059, 10 cm×10 cm) by plasma CVD. A resist is formed on the surface of the film 702. The resist may be a positive or negative type. By commonly used photolithography patterning process, a resist mask 703 is patterned to a desired pattern. (FIG. 8A)

In this state, ozone water is applied in contact with the resist mask 703. The apparatuses of FIGS. 4 to 6 may be used as a spin coater. While the stage 201 is rotated at a rotation speed of 3000 rpm for 3 minutes, ozone water is applied (dropped) from the nozzle 401 (501). A solution which ozone of about 1 to 20 ppm is dissolved into pure water may be used as ozone water.

An acetate solution (5 ml) containing nickel of 100 ppm is applied in a case wherein the substrate has 10 cm×10 cm in size by using the apparatuses of FIGS. 4 to 6 as a spin coater.

While a stage 201 is rotated at a rotation speed of 50 rpm, a nickel acetate solution is applied (dropped) from a nozzle 401 (501), to perform spin coating for 10 seconds. Since ozone water is applied in contact with the resist mask 703 and therefore a contact angle to a solution becomes small, a film 704 is formed uniformly on the entire surface of the substrate 701.

After this state is maintained for 5 minutes, the stage 201 is rotated at a rotation speed of 2000 rpm, to performing spin dry. This state may be maintained while the stage 201 is rotated at a rotation speed of 0 to 150 rpm. (FIG. 8B)

When the resist mask 703 is removed by oxygen ashing, in an opening portion 703a, a region 705 which nickel element is adsorbed is formed selectively in the amorphous silicon film 702. The resist mask may be removed by annealing in an atmosphere including oxygen.

After that, the amorphous silicon film 702 is crystallized by heat treatment at 550° C. for 4 hours in an atmosphere including nitrogen. In this state, as shown by an arrow in FIG. 8C, crystal growth is performed from the region 705 into which nickel is introduced to a region into which nickel is not introduced, along a transverse direction. In FIG. 8C, numeral 706 represents a region into which nickel is introduced directly and which is crystallized, and numeral 707 is a region which is crystallized in a transverse direction.

In the embodiment, using the apparatus of FIG. 2, for example, ozone water contact and nickel acetate solution applying can be performed in the same apparatus. In this case, ozone water may be applied from the nozzle 203 and nickel acetate solution may be applied from the nozzle 204.

In Embodiments 6 and 7, nickel is used as a metal element for promoting crystallization of silicon. At least one element selected from Ni, Pd, Pt, Cu, Ag, Au, In, Sn, P, As, and Sb can be used.

By the present invention, it is possible to uniformly apply a solution to a substrate on which a resist is formed by ultraviolet light irradiation or ozone water contact to the surface of the resist because, to decrease a contact angle of the solution, in solution applying methods in which the moving speed of etching solution over the surface of the substrate is high, for example spin coating.

In particular, even when using a solution having a large contact angle, or even when fine patterns in which the pattern width is of the order of several μm or less, a solution can penetrate sufficiently between the resists forming the pattern, so that uniform etching without irregularities and uniform crystallization of a silicon film is possible.

Also, by suitably moving a solution outflow portion, it is possible to apply uniformly a solution in comparison with a conventional spin coating. Even if a substrate having large size is used, a solution can be applied uniformly.

What is claimed is:

1. An etching method for manufacturing a semiconductor device comprising the steps of:

preparing a substrate having a surface to be patterned;

forming a resist mask on said surface;

applying a liquid etchant to said surface having the resist mask thereon;

selectively etching said surface by using said liquid etchant in accordance with said resist mask, wherein a wettability of a surface of said resist mask with respect to the liquid etchant is increased by treating the surface of the resist mask before said applying step and wherein the wettability is increased by exposing the surface of the resist mask with water comprising ozone dissolved in a concentration from 0.1 to 20 ppm.

2. An etching method for manufacturing a semiconductor device comprising the steps of:

forming a conductive film over a substrate;

forming a resist mask on said conductive film;

treating a surface of said resist mask with a water comprising ozone dissolved in a concentration from 0.1 to 20 ppm; and then applying a liquid etchant to the conductive film having the resist mask thereon after finishing the treatment with said water; and selectively etching the conductive film by using a liquid etchant in accordance with said resist mask, wherein a wettability of a surface of said resist mask with respect to the liquid etchant is increased by said water.

3. An etching method according to claim 2 wherein said conductive film comprises aluminum.

4. An etching method according to claim 2 wherein said liquid etchant comprises phosphoric acid, acetic acid and nitric acid.

5. A method of manufacturing semiconductor device comprising the steps of:

depositing a semiconductor film comprising amorphous silicon on an insulating surface of a substrate;

crystallizing said semiconductor film;

patterning the crystallizing semiconductor film into a plurality of semiconductor islands;

forming an insulating film over said plurality of semiconductor islands;

forming a conductive film on said insulating film;

forming a patterned mask on said conductive film;

treating said patterned mask with water comprising ozone dissolved in a concentration from 0.1 to 20 ppm; and then etching said conductive film into gate electrodes in accordance with said patterned mask using a liquid etchant.

6. A method according to claim 5 wherein said conductive film comprises aluminum.

7. A method according to claim 5 wherein said patterned mask comprises a resist material.

8. A method of manufacturing a semiconductor device comprising the steps of:

depositing a semiconductor film comprising amorphous silicon on an insulating surface of a substrate;

forming a patterned resist mask on said semiconductor film;

treating said patterned resist mask and an exposed surface of said semiconductor film with water comprising ozone dissolved in a concentration from 0.1 to 20 ppm to oxidize said exposed surface of said semiconductor film; and introducing a metal containing material for facilitating crystallization of said semiconductor film after the treating step.

9. The method of claim 8 wherein said metal is selected from the group consisting of Ni, Pd, Pt, Cu, Ag, Au, In, Sn, P, As, and Sb.

10. The method of claim 8 wherein a heat treating step is performed in order to crystallize said semiconductor film after introducing said metal containing material.

11. The method of claim 10 wherein said patterned resist mask is removed before said heat treating step.

* * * * *